Figure 1:
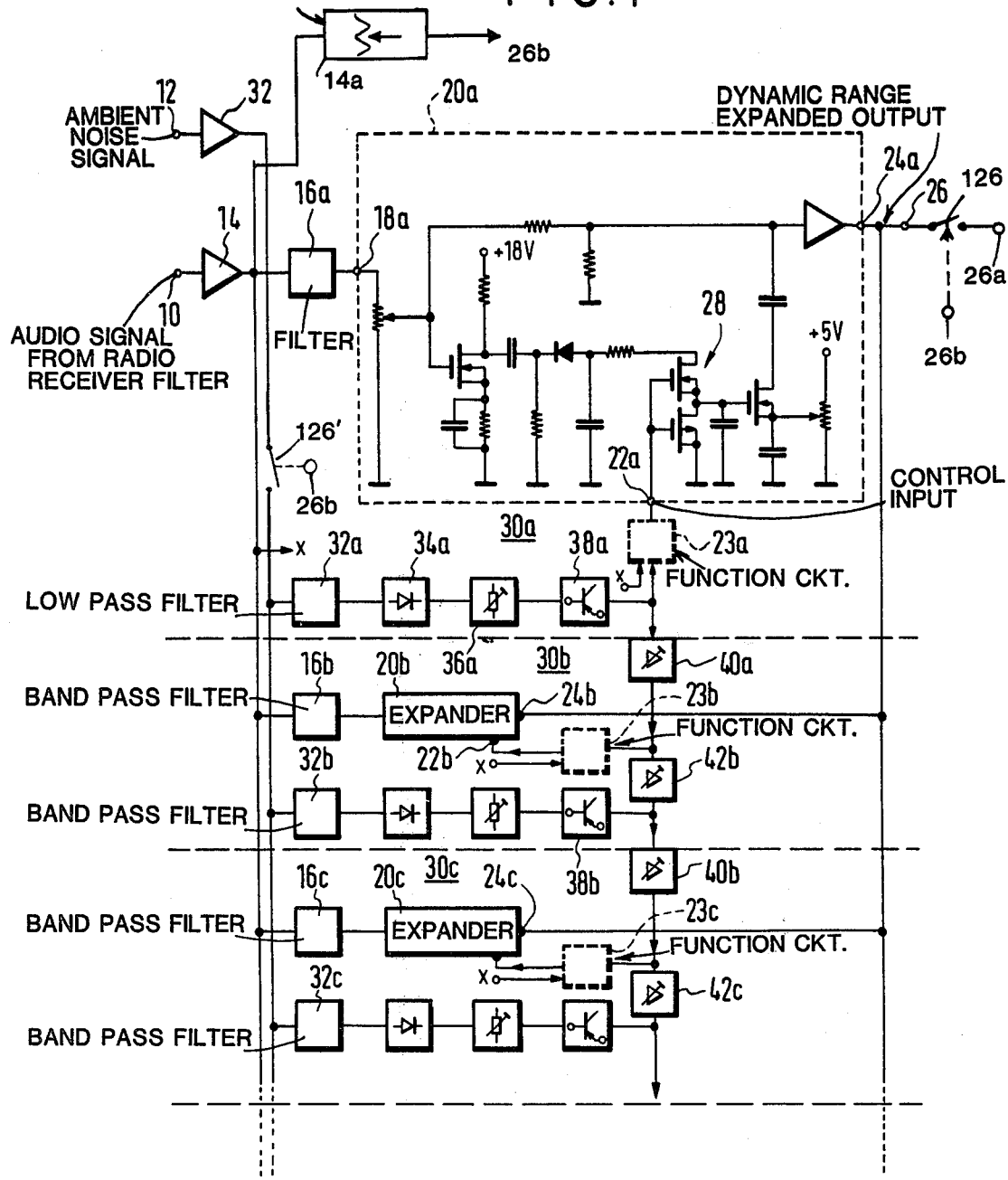

United States Patent [19]

Fricke et al.

[11] 4,381,488

[45] Apr. 26, 1983

[54] DYNAMIC VOLUME EXPANDER VARYING AS A FUNCTION OF AMBIENT NOISE LEVEL

[76] Inventors: Jobst P. Fricke, Wüllnerstrasse 100, Köln; Ulrich R. Müller, Carl v. Linnéstrasse 36, Frechen, both of Fed. Rep. of Germany

[21] Appl. No.: 235,514

[22] Filed: Feb. 18, 1981

[51] Int. Cl.³ ............................................. H04B 1/64
[52] U.S. Cl. ..................................... 333/14; 179/1 P
[58] Field of Search ............. 179/1 P, 1 VL; 330/149, 330/279; 333/14; 455/72, 231, 296, 307, 310

[56] References Cited

U.S. PATENT DOCUMENTS

| | | | |
|---|---|---|---|
| 3,160,707 | 12/1964 | Meyers | 330/149 X |
| 3,681,705 | 8/1972 | Spence | 330/149 |
| 4,061,874 | 12/1977 | Frieke et al. | 179/1 P |

FOREIGN PATENT DOCUMENTS

| | | |
|---|---|---|
| 2838293 | 3/1979 | Fed. Rep. of Germany. |
| 2044564 | 10/1980 | United Kingdom ................ 330/149 |

*Primary Examiner*—Paul L. Gensler
*Attorney, Agent, or Firm*—Frishauf, Holtz, Goodman & Woodward

[57] ABSTRACT

To provide for response of audio reproduction equipment with the full dynamic level range, for example of music, intended by a composer, although radio signals transmitted have been compressed to reduce the signal-noise level, an expander circuit (20a, 20b, 20c) is activated based on ambient noise level conditions as sensed, for example, by a microphone (12) which determines the ambient noise level. If the ambient noise level, for example within certain frequency bands, as selected by filters (32a, 32b, 32c) is low, so that the full dynamic range (difference between low volume and high volume passages) can be reproduced, a range expander (20a, 20b, 20c) is controlled, for example within selected frequency bands, to reproduce the respective frequencies, or the overall signal, with a dynamic range greater than that of the received compressed signal and, preferably, corresponding to the dynamic range of the original signal which was then compressed for transmission. To prevent a microphone from responding not only to ambient noise but also to the reproduced program, the reproduced program level can be sensed, for example, by an amplitude detector (14a) and, when the reproduced program level is low, briefly entirely interrupt the program level while activating the microphone to sense then ambient noise level and, if the sensed ambient noise level is low, thus permit control of the dynamic range expansion circuitry to expand the dynamic range of the reproduced signal to improve listening conditions.

9 Claims, 3 Drawing Figures

DYNAMIC VOLUME EXPANDER VARYING AS A FUNCTION OF AMBIENT NOISE LEVEL

This invention relates to an audio signal amplifier circuit and more particularly to a high fidelity amplifier circuit for an audio signal reproducer which is adapted to use in quiet surroundings although the audio signal fed to the reproducer amplifier has undergone volume compression at the source to allow for noisy surroundings.

In recording music and speech, it is common practice to restrict the volume range at the transmitter or production end, i.e., forte passages are amplified less than piano passages, for example. The object of this step is to match the signal level volume range of the original sound signal to the channel volume range available for transmission and/or recording.

One way of matching the signal level volume range to the available channel volume range is for the sound engineer or sound recording engineer to make the necessary manual adjustments in the studio (recording level control), and this is equivalent to volume range compression of the original signals in its effect. Automatic compression and limiting amplifiers are also known.

In some transmission systems (cassettes, or magnetic tape) the volume range is expanded again (volume expansion) at the end of the transmission channel for reproduction. Ideally, a volume expander restores the dynamic conditions at the input to the volume compressor at the source. Its effect is therefore the reciprocal of the volume compressor. Automatically operating systems consisting of a compressor and expander with reciprocal effect are the compander systems such as the Dolby and Telcom.

In comparison with this expansion, compression may be advisable at the reproduction end if comprehension or audibility are to be improved under reproduction conditions involving noisy surroundings. A system for the volume compression of audio signals in dependence upon noise level, allowing for variations in noise intensity per unit of time and, where applicable, the spectral composition of the noise, is disclosed in U.S. Pat. No. 4,061,874, Fricke, to which German Pat. No. 24 56 468 corresponds.

In addition to the above-mentioned technically necessary steps at the transmission or production end, there is a novel development in which the signal level volume range is kept small in order to meet the wishes of the majority of listeners. Enquiries have shown that a limitation to 30–40 dB is preferred. Obviously most listeners do not listen under hi-fi conditions most of the time. The reason for this is not only noise from the surroundings (e.g. kitchen and road noise, car and vehicle noise) and the low quality of reproduction equipment, but also inadequate sound insulation between the listener and others living in the house, and the type of listening, i.e. the attitude of the listener to the program information.

On the occasion of a seminar ("Fachseminar Hörfunk-FH2") held by the Schule für Rundfunktechnik (=Radio Engineering College) in Nuremberg, Fed. Rep. Germany, the listener's legitimate desire for more intense volume compression at the transmitter end was discussed and consideration given to steps in that direction. The listener's desire for a broader volume compression than previously used was apparently accepted and appropriate steps were considered possible, inter alia because the spectral volume range of the signal already transmits adequate information on the signal volume range and the hearing itself acts as a volume expander when noise is present, as is disclosed in U.S. Pat. No. 4,061,874 and described in the paper read at the Tonmeister-Tagung (=Sound Engineers' Conference) entitled "Kompression zur Herstellung natürlicher dynamischer Verhältnisse beim Abhören unter verschiedenen umweltbedingten Störschalleinflüssen" (=Compression for restoring natural dynamic conditions when listening under noisy surrounding conditions) (Berlin 1978).

There is therefore a trend to depart from the requirement of transmitting with high fidelity to produce a faithful reproduction of the original signals, as has already happened in respect of stereo.

A volume compression to allow for normal or special listening conditions can therefore be carried out either at the transmission and production end or at the listener's and reproduction end.

Compression at the transmitter end, of course, cannot match the specific noise conditions and reproduction equipment at the place of reproduction. The compressed volume range transmitted for conventional listening conditions is too flat for high fidelity reproduction requirements, under optimum reproduction and listening conditions i.e. in the absence of noise or extraneous disturbances and distractions.

Since the ear itself effects volume expansion in the presence of noise (see pages 100 to 107 of the "Tagungsbericht Tonmeistertagung Berlin 1978" (=Report on the Sound Engineers' Conference, Berlin 1978), an approximation to hi-fi volume range is again achieved if the intelligence signals are compressed appropriately before reproduction (see U.S. Pat. No. 4,061,874, and corresponding German Pat. No. 24 56 468). In the absence of noise, when the ear does not itself effect volume expansion, the volume range of the signals compressed at the source is found to be inadequate.

The invention: It is an object to provide an audio signal amplifier circuit for an audio signal which has undergone volume compression at the source, said circuit so matching the reproduction to varying surrounding noise conditions that high fidelity reproduction conditions can be obtained as far as possible at all times. Briefly, a dynamic volume expansion circuit is provided, the degree of dynamic volume expansion being controllable. Ambient noise level is detected, for example by a microphone, or the user may consider that the ambient noise level is such that precompressed signals can be suitably expanded, so as to retrieve the original dynamic range of the signal being reproduced. In accordance with a feature of the invention, a microphone is used, to pick up ambient noise levels, the output from the microphone controlling the degree of expansion. To prevent the microphone from picking up the program which is being reproduced, an extremely short time interruption of the program can be commanded, during which time the microphone is activated and provide the output signal of the ambient noise level which, in turn, controls the dynamic expansion of the dynamic volume expander. In accordance with a preferred feature of the invention, the interruption of the program occurs only during very soft or piano passages of the signal, which can be sensed, for example, by providing an amplitude detector connected to the audiosignal and interrupting the audiosignal only if the level of the signal detected by the amplitude detector is below a predetermined level.

The audio signal amplifier circuit according to the invention thus provides a noise-dependent volume expansion of the signal for reproduction by the loudspeaker, headphones and the like, which signal had undergone volume compression at the source for the reasons indicated above. In accordance with the prior art, expansion at the place of reproduction was only a compensatory step in reciprocal relationship to the compression at the production end. In accordance with the present invention, dynamic range expansion is noise-dependent.

According to an advantageous feature of the invention, the volume expansion is effected selectively in respect of frequency in dependence on the frequency composition and intensity of the noise at the place of reproduction.

The invention thus provides individual steps at the reproduction end to compensate for any deterioration in the quality of reproduction due to the usual volume compression which is carried out at the transmitter end and which may be increased still further. The invention thus prevents any detrimental treatment of those listeners whoe have favourable listening conditions available or who have different listening expectations, by carrying out a noise-dependent volume expansion at the listener's end.

Drawings:

FIG. 1 is a circuit diagram of one exemplified embodiment of a circuit according to the invention.

Figure 2:
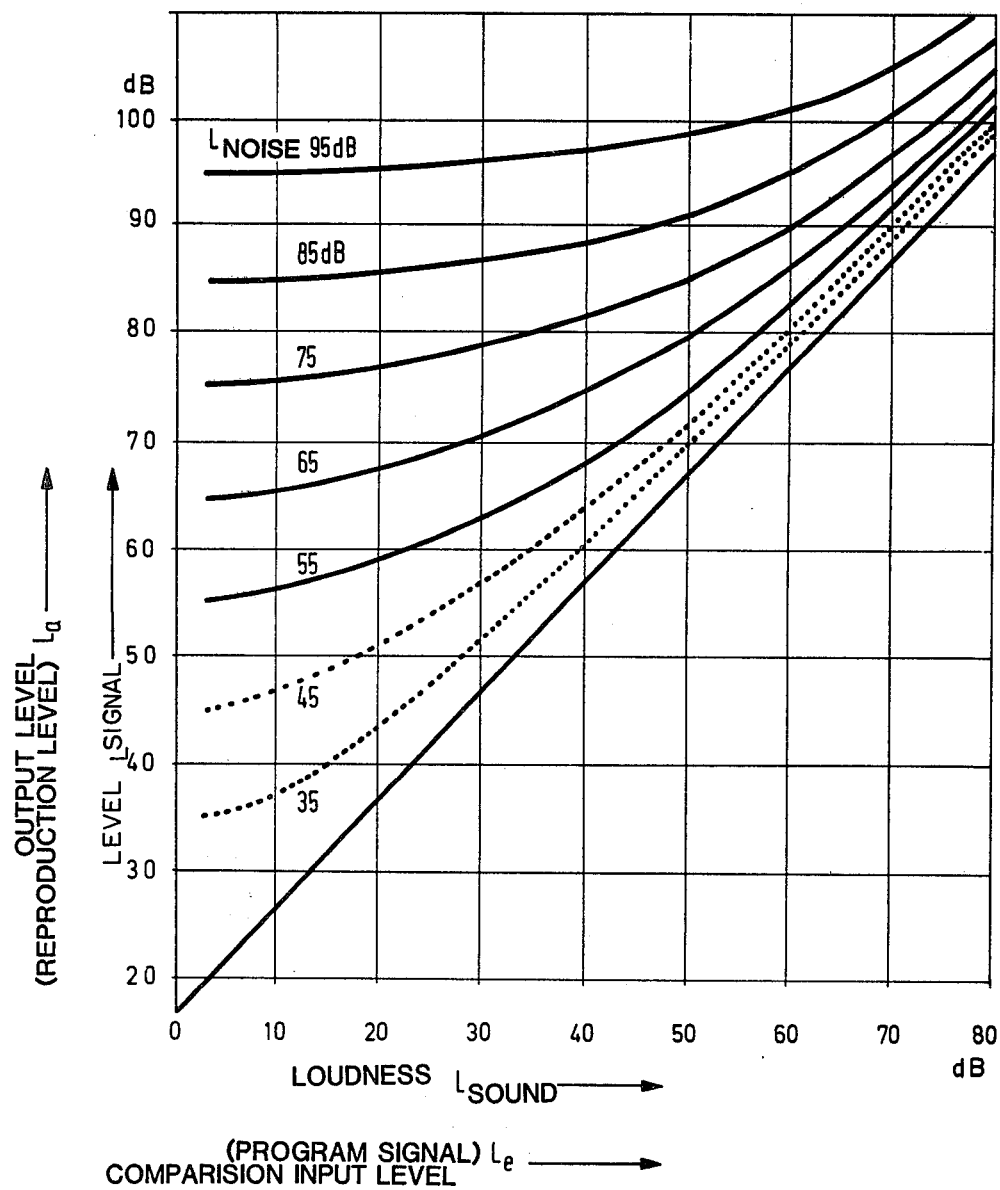
Figure 3:
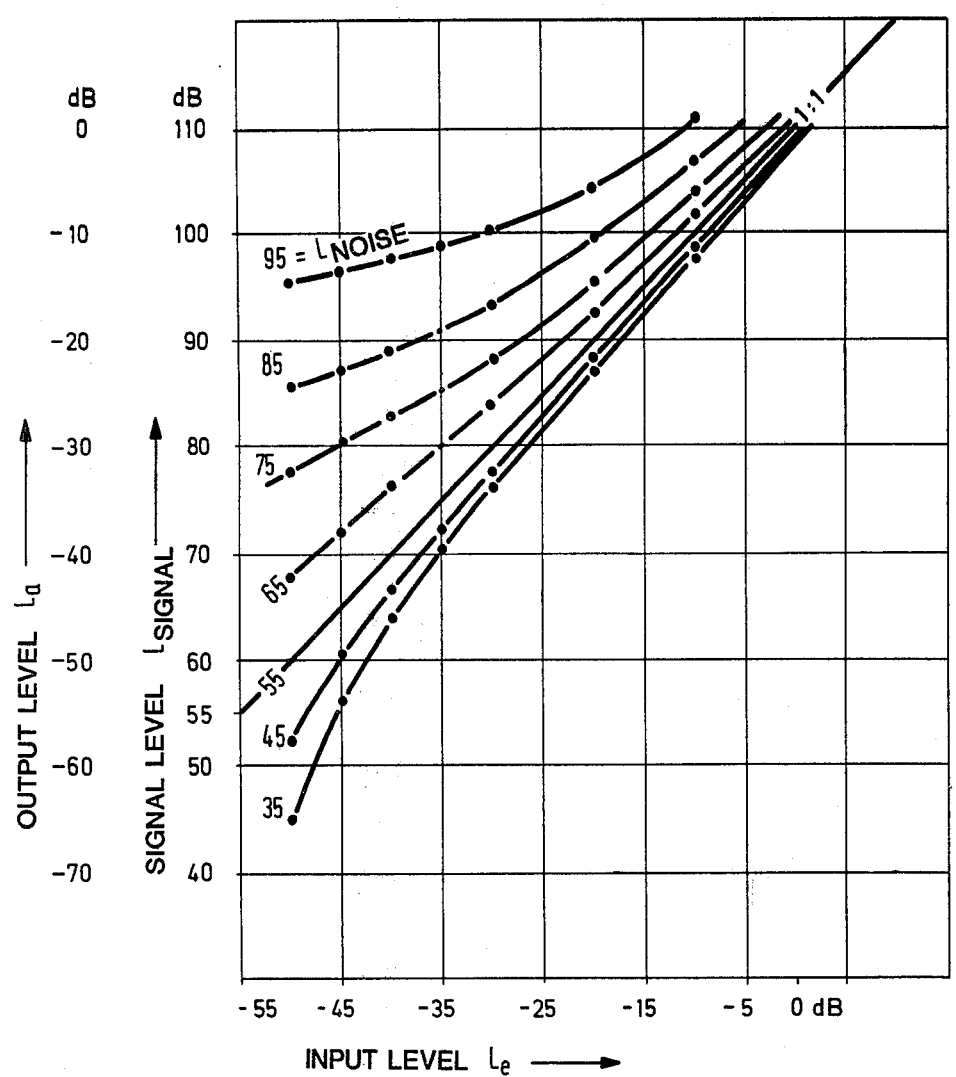

FIG. 2 shows compression curves for non-precompressed intelligence signals with the original volume range for different levels of a wide-band noise, calculated from the curves for signals whose loudness has been swamped by uniformly concealing noise, the x-axis showing the amplitude of the program signal while the y-axis shows the amplitude of the reproduced signal; the noise level is the parameter, and FIG. 3 shows compression and expansion curves calculated from the curves in FIG. 2, for different levels of a wide-band noise for a predetermined signal level range (program volume range) from 37 to 40 dB.

The circuit shown in FIG. 1 comprises an input 10 for the recorded or transmitted signal, and this input may, for example, be connected to the output of the demodulator of a radio receiver. The circuit further comprises a noise input 12, to which a noise signal is fed from a noise microphone or the like. The required signal input 10 is coupled, via an amplifier 14 and a filter circuit 16a, to a signal input 18a of a volume expander 20a, which also has a control input 22a, to which a volume range control signal is fed, and a signal output 24a connected to an output terminal 26 of the circuit, to which reproduction means, e.g. headphones, or an output amplifier and loudspeaker, can be connected.

The volume expander 20a illustrated is a circuit which is known in principle (for example see "Electronics World", June 1971, pages 54 and 55), except that the rotary potentiometer used for adjustment of the volume expansion in the known circuit is replaced by an electronic potentiometer 28 comprising two field effect transistors (FET) of complementary conductivity, the channels of which are connected in series and the control electrodes of which are connected to the control input 22a so that the resistances of the FET channels are contra-controllable by means of the volume range control signal. The magnitude of the volume range control signal fed to the control input 22a thus determines the magnitude of the volume expansion produced by the volume expander 20a.

The volume range control signal is generated by a circuit 30a. The noise signal input 12 is connected to the input of circuit 30a via an amplifier 32. Circuit 30a comprises a filter circuit 32a, a rectifier circuit 34a, an adjustable attenuator 36a, e.g. a potentiometer, and a buffer amplifier 38a, e.g. an emitter follower, the output of which in the simplest case (expansion inversely proportional to noise level) is coupled to the control input 22a. For more stringent requirements, e.g. for exact simulation of the curves shown in FIG. 3, a function circuit 23a having the required transmission function may be connected in series with the control input 22a. The function circuit may, for example, comprise two digital/analog converters, which convert the signal from circuit 30a and the required signal fed from the output of amplifier 14 via a terminal x, to a digital value in each case, an appropriately programmed reference memory (ROM, PROM), the locations of which are addressable by the digital values and contain a corresponding digital output value, and a digital/analog converter which converts the digital output value to an analog volume range control signal.

In the simplest case, the volume expansion according to the invention can be effected independently of the noise frequency content. In that case, the filter circuits 16a and 32a may be omitted and the operation of the circuit described hereinbefore will now be explained on this basis. The terms used in connection with the volume range have the following meanings:

Original volume range: The amplitude range in decibels of the original sound, e.g. original speech, original music, and so on.

Program volume range: The amplitude range in decibels of the signal which represents the original sound and the volume range of which has been reduced in comparison with the original volume range by the producer or by automatic electronic means, and hence the volume range of the signal at the audio output of a radio receiver or tape player.

Reproduction volume range: Amplitude range of the sound signal reproduced by the loudspeaker, headphones, or the like.

Auditory volume range: The amplitude range subjectively perceived by the human ear when it receives the reproduced signal with the reproduction volume range (this can be represented by the signal level of reference tones adjusted to the same loudness level sensation).

It was explained in the introduction that an even greater volume compression must be expected from radio transmissions in the future. In respect of noise level and listening conditions, the volume compression is to be in keeping with the conditions applicable to the majority of listeners. If a relatively considerably compressed signal having a program volume range of, for example, 25 dB is reproduced in surroundings subject to very little noise (effective noise pressure level 35 dB and less), the ear finds the auditory volume range inadequate. A volume range of 65 dB is subjectively satisfactory to some extent, but this is not achieved until the reproduction volume range has been expanded to 49 dB, and an auditory volume range of 70 dB is obtained after expansion of the reproduction volume range to 54 dB.

Thus each noise level is basically associated with just a single specific signal volume range which is optimum for the reproduction and listening conditions, i.e. a specific reproduction volume range. According to the invention, this optimum reproduction volume range is obtained by expansion of the signal supplied for reproduction, expansion being dependent (a) upon the pre-compression and (b) upon the noise level applicable at the time of reproduction.

Expansion should start at a threshold value which is dependent upon the volume range adjusted at the transmitter or production end, i.e. the program volume range, and which can advantageously be adjusted by the listener at his own set. The following Table 1 gives approximate values for this:

TABLE 1

| Program volume range | 54 | 45 | 37 | 25 | 15 dB |
|---|---|---|---|---|---|
| Noise level threshold | 35 | 45 | 55 | 65 | 75 dB |
| Position of reproduction volume range | 35–89 | 45–90 | 55–92 | 65–90 | 75–90 dB |
| Auditory volume range accordingly: | 70 | 70 | 70 | 65 | 60 dB |

Thus the volume expansion according to the invention should start if the noise threshold falls below the values indicated in line 2 of the above Table 1. For example, given a program volume range of 25 dB obtained, for example, by compression of the original volume range from approximately 75 dB to 25 dB at the transmission end (compression ratio 1:3), expansion should start if the noise level falls below 65 dB. Given a noise level of 55 dB, the volume expansion should in these conditions produce a reproduction volume range of 37 dB for example. Accordingly, given a program volume range of 37 dB, expansion should start when the noise level falls below 55 dB.

If the noise thresholds indicated in line 2 of Table 1 are exceeded, further volume compression in accordance with U.S. Pat. No. 4,061,874, and corresponding German patent specification No. 24 56 468 is advantageously carried out. Given greater pre-compression (lower program volume range), the volume compression in dependence on the noise level does not occur until the latter reaches higher values.

Table 2 at the end of the specification gives further details regarding the noise thresholds below which the volume expansion according to the inventin should be carried out and above which the known additional volume compression should be effected, together with the reproduction volume range which must be offered for a required auditory volume range according to the noise level.

Given an original volume range of 75 dB (60 dB), the program volume range values indicated are obtained with the compression factors indicated in the following Table 3:

TABLE 3

| Program volume range (dB) | 54 | 45 | 37 | 25 | 15 | 10 |
|---|---|---|---|---|---|---|
| Compression ratio: | 1:1.4 (1:1.1) | 1:1.7 (1:1.3) | 1:2 (1:1.6) | 1:3 (1:2.4) | 1:5 (1:4) | 1:7.5 (1:6) |

A study of Tables 1 and 2 will show that a greater reproduction volume range more closely approaching the original volume range is desirable with decreasing noise level. This is achieved by the invention in which the signal for reproduction undergoes expansion in dependence on the noise level, expansion increasing in fact as the noise level decreases. In this way, the original volume range can be restored with optimum listening conditions.

The impression of the original loudness and loudness differences is produced in the listener over a wide noise range as a result of the combination of the known noise level dependent volume compression and the noise level dependent volume expansion according to the invention. The changeover from compression to expansion occurs when the noise level falls below the thresholds indicated in Tables 1 and 2 towards lower noise values.

If the original volume range of about 75 dB is compressed to a program volume range of 21, 29, 37, 45 or 54 dB, and an auditory volume range of about 70 dB is the objective, no change of the program volume range is necessary at noise levels of 75, 65, 55, 45 or 35 dB (see line 5 in Table 2). On the change to a different noise level, the expansion (or compression) is equal to the difference between the volume range associated with the program volume range and the volume range associated with the noise level. The curves (see FIG. 2) give the expansion (or compression) as the difference between the volume range shown by the program volume range curve and the volume range corresponding to the noise level curve. The expansion (or compression) must be carried out in accordance with the curve associated with a specific noise level. The specified program volume range is governed by expansion (or compression) curves obtained by differentiation between the program volume range curve and the noise level curve for each individual program volume range value. This is shown by the graph in FIG. 3 for a program volume range of 37 to 40 dB and a noise level of 55 dB. The curves shown in FIG. 3 illustrate what the electronics have to simulate, i.e., the circuit 30a in conjunction with the circuit 23a and the volume expander 20a in the case of the volume expansion according to the invention. The noise level controls the change from one curve to another, while the curve indicates how the required signal is expanded (or compressed) in dependence on its own signal level curve. The reference parameter which determines the auditory volume range for a specific program volume range is adjusted at the place of reproduction, e.g. by means of the attenuator 36a, which may be provided with a calibrated scale.

According to a preferred embodiment of the invention, the audio frequency range is divided up into a number of sub-ranges and the degree of expansion in each audio frequency sub-range is adapted to the spectral proportion of the noise there, i.e., for example, the surrounding noise, since in this way it is possible very largely to restore a volume range corresponding to the original.

Preferably, the audio frequency range is divided up into 6 sub-ranges or bands having the end frequencies 0–130 Hz, 130–260 Hz, 260–600 Hz, 600–1500 Hz, 1500–4000 Hz and 4000–16,000 Hz.

In the circuit shown in FIG. 1, the frequency range is divided by two banks of filters which include the filters 16a and 32a. The latter may therefore be, for example, low-pass filters having 130 Hz as the top cutoff frequency. The inputs of additional filters for the other sub-ranges are connected to the output of the amplifier 14, e.g. a band-pass filter 16b having a pass-band of 130 to 260 Hz, a band-pass filter 16c with a pass-band of 260 to 600 Hz, and so on. A band-pass filter 32b with a pass-band 130 to 260 Hz, a band-pass filter 32c with a pass-band of 260 to 600 Hz, and so on, are correspondingly connected to the output of amplifier 32. For each frequency range there is also provided an expander 20b, 20c, etc., and a circuit 30b, 30c, etc., and if required a function circuit 23b, 23c, etc., to generate an associated volume range control signal, and these circuits are connected as described hereinbefore with reference to the components 20a, 23a, and 30a. The outputs 24b, 24c, etc., of the expanders are connected to the common output terminal of the system.

The effect of the volume expansion control in the individual frequency bands is that expansion is effected only in those bands in which there is no noise signal of appreciable intensity.

Since the concealing and swamping effect of low-frequency noise signals on high-frequency intelligence signals is greater than that of high-frequency noise signals on low-frequency intelligence signals, i.e. since the masking and swamping effect of a noise signal is greater towards the high frequencies than the low frequencies, according to another aspect of the invention provision is made for additional control of the expansion (or compression) of higher frequency bands by noise signal components in adjacent lower frequency bands.

To effect this additional control, the circuit shown in FIG. 1 contains amplifiers 40a, 40b, etc., which have adjustable gain. The amplifier 40a couples the volume range control signal of the frequency range 0-130 Hz of a predetermined attenuated amplitude to the control signal input of the expander 20b for the frequency range 130 to 260 Hz. To prevent any reaction on the next higher frequency band, a buffer amplifier 42b is provided between the amplifier 38b for the 130-260 Hz volume range control signal and the control signal input 22b of expander 20b, and buffer amplifier 42b is also preferably of adjustable gain. Corresponding circuits, including buffer amplifier 42c may also be provided between the circuitry for the other frequency bands.

The amplifiers 40, which each feed a volume range control signal of a lower frequency band to the volume expander for the next highest frequency band, preferably attenuate the signal by about 30 dB.

If the buffer amplifier 42 is omitted, the volume range control signals of a lower frequency band have a continuously decreasing effect on the higher-frequency bands, a feature which is in many cases advantageous.

In the simplest case it is sufficient for the same compression or expansion to be used in the entire audible frequency range above the middle frequency of the noise signal as in the middle range of the noise signal itself. To this end, the volume range control signals of the lower frequency bands may be fed to the expanders for all the higher-frequency bands through suitable coupling circuits. The latter may select the maximum volume range control signal at any time, i.e., operate as an exclusive OR gate, or provide a non-linear, more particularly a substantially logarithmic, summation, of the volume range control signals.

It has already been stated that the volume expander according to the invention may be combined with a volume compressor which provides further volume compression when the noise level exceeds a predetermined value. A circuit of this kind will then provide a volume expansion or compression depending upon the noise level. In either case, the volume range of individual frequency bands of the audio signal can vary in dependence on an analysis of the noise as described in the case of the volume compression in U.S. Pat. No. 4,061,874 and corresponding German patent specification No. 24 56 468.

The circuit for varying the audio signal volume range (volume expander or compressor) contained in the audio signal amplifier circuit may be disconnectable.

If the noise detector comprises a microphone, it is advantageous to provide a circuit, shown schematically as interrupt switch 126, which temporarily interrupts the sound reproduction to final terminal 26a, and the noise detector is so constructed by including a switch 126' in the noise signal line as to generate the noise signal only during the brief periods in which the sound reproduction is interrupted—as shown schematically by control connection 26b. The interruption may be so short as to be practically imperceptible to the ear and/or may be effected in dependence on the amplitude of the audio signal detected by an amplitude detector 14a controlling via terminal 26b the switch 126 so that the interruption occurs only in soft passages and is therefore less noticeable than if it were made in loud passages.

Instead of temporarily interrupting the sound reproduction, the noise level may alternatively be measured—without interrupting the sound reproduction—at times when the audio signal level is below a predetermined threshold.

The latter steps ensure that the intelligence signal is not falsely interpreted as noise.

The values listed in the Tables can be interpolated by means of the groups of curves shown in FIG. 2. These curves govern the correct auditory control of expansion (and of the known compression). Their slope gives the compression or expansion ratio in dependence on the value of the program volume range. The parameter is the noise level.

The volume range control (expansion or expansion+compression) may advantageously be combined with a loudness variation, e.g., the amplifier may include a linear amplitude stage, the gain of which is controlled basically in the same sense as the variation in the noise amplitude. The gain may, for example, be a linearly proportional function of the noise amplitude.

TABLE 2

Signal level and program volume range required for a given auditory volume range in dependence on the noise level; and relationship between the threshold at which the volume range compression or expansion starts and the predetermined program volume range for a selected auditory volume range. (All values in dB)

| Auditory volume range | | Noise level (threshold) | | | | | |
|---|---|---|---|---|---|---|---|
| | | 35 | 45 | 55 | 65 | 75 | 85 |
| 55 | Program volume range Level | 39 | | | | | |
| | from . . . to | 35-74 | | | | | |
| 60 | Program volume range | 44 | 36 | 28 | 21 | 15 | 10 |

TABLE 2-continued

Signal level and program volume range required for a given auditory volume range in dependence on the noise level; and relationship between the threshold at which the volume range compression or expansion starts and the predetermined program volume range for a selected auditory volume range. (All values in dB)

| Auditory volume range | | Noise level (threshold) | | | | | |
|---|---|---|---|---|---|---|---|
| | | 35 | 45 | 55 | 65 | 75 | 85 |
| 65 | Level from ... to | 35–79 | 45–81 | 55–83 | 65–86 | 75–90 | 85–95 |
| | Program volume range | 49 | | 32 | 25 | 18 | |
| 68 | Level from ... to | 35–84 | | 55–87 | 65–90 | 75–93 | |
| | Program volume range | | | 35 | | | |
| 70 | Level from ... to | | | 55–90 | | | |
| | Program volume range | 54 | 45 | 37 | 29 | 21 | 16 |
| 80 | Level from ... to | 35–89 | 45–90 | 55–92 | 65–94 | 75–96 | 85–101 |
| | Program volume range | | | | | 30 | 23 |
| 82 | Level from ... to | | | | | 75–105 | 85–108 |
| | Program volume range | | | | | | 25 |
| | Level from ... to | | | | | | 85–110 |

We claim:

1. Audiosignal amplifier circuit for an audiosignal reproducer which is adapted for use in low noise level surroundings for high fidelity reproduction of audiosignals which have undergone volume compression at a source, comprising, in accordance with the invention a controllable dynamic volume expander (20) having the precompressed audio signals applied thereto;

and means (12, 32, 32a) connected to and for controlling the degree of dynamic expansion by the dynamic volume expander of the precompressed signals as a function of ambient noise levels, in a direction of increasing the dynamic range of expansion of the expander with decreasing noise levels.

2. Amplifier according to claim 1 wherein the volume expander control means includes means (12) for sensing amplitude of the ambient noise signals of deriving noise signals, and means (30a, 30b, 30c; 28) responsive to said noise signals to increase the dynamic expansion of the volume expander with decreasing noise sensed by said noise sensing means (12).

3. Amplifier according to claim 2 further comprising a first filter circuit (16a, 16b, 16c) connected to receive the precompressed audiosignals and dividing said audiosignals into a plurality of frequency bands;

second filter means (32a, 32b, 32c) connected to said noise signal sensing means and dividing the noise signal into a plurality of frequency bands;

and wherein said controllable volume expander comprises a plurality of dynamic volume range expansion circuits connected to and controlled by each frequency bands in a direction of increasing the dynamic expansion of the expander with decreasing noise within the respective frequency band.

4. Amplifier according to claim 3 including controlled coupling elements (40a, 40b) for connecting the noise signal of a lower frequency band with reduced amplitude to the controllable dynamic volume expander (20b, 20c) of an adjacent higher frequency band.

5. Amplifier according to claim 2 wherein said means for sensing the amplitude of noise signals comprises a microphone (12) exposed to ambient environmental noise conditions.

6. Amplifier according to claim 5 including switching means (126) temporarily interrupting an output signal from said controllable dynamic volume expander (20) and, during said interruption time, connecting said microphone to obtain a signal of ambient and environmental noise independent of reproduction of signals from said circuit.

7. Amplifier according to claim 5 including means (14a) sensing the signal level of said audiosignal;

and switching means (126') connecting said microphone to control the degree of dynamic expansion of the expander only during occurrence of audiosignals below a predetermined level.

8. Amplifier according to claim 6 including means (14a) sensing the signal level of said audiosignal;

and second switching means (126') connecting said microphone to control the degree of dynamic expansion of the expander only during occurrence of audiosignals below a predetermined level; the switching means (126) interrupting reproduction of the audiosignals during connection of the microphone.

9. Amplifier according to claim 3 wherein said filters are connected in a circuit analyzing the frequency distribution of the noise signals;

and said controllable dynamic volume expanders are connected to the respective filters for controlling the respective expansion of the signals at the individual frequency bands in accordance with an analysis of the frequency distribution of the noise signals.

* * * * *